United States Patent
Mochiji

(10) Patent No.: US 11,604,083 B2
(45) Date of Patent: Mar. 14, 2023

(54) OPERATION DEVICE

(71) Applicant: ALPS ALPINE CO., LTD., Tokyo (JP)

(72) Inventor: Hiroyuki Mochiji, Iwaki (JP)

(73) Assignee: ALPS ALPINE CO., LTD., Tokyo (JP)

(*) Notice: Subject to any disclaimer, the term of this patent is extended or adjusted under 35 U.S.C. 154(b) by 0 days.

(21) Appl. No.: 17/407,973

(22) Filed: Aug. 20, 2021

(65) Prior Publication Data

US 2022/0057237 A1 Feb. 24, 2022

(30) Foreign Application Priority Data

Aug. 24, 2020 (JP) .............................. JP2020-140919

(51) Int. Cl.
| | |
|---|---|
| *G01D 5/24* | (2006.01) |
| *G06F 3/039* | (2013.01) |
| *G06F 3/0362* | (2013.01) |
| *G06F 3/044* | (2006.01) |

(52) U.S. Cl.
CPC ......... *G01D 5/2405* (2013.01); *G06F 3/0362* (2013.01); *G06F 3/0393* (2019.05); *G06F 3/044* (2013.01)

(58) Field of Classification Search
CPC .... G06F 3/0362; G06F 3/0312; G06F 3/0346; G06F 3/044; G06F 3/0393; G01D 5/2405
See application file for complete search history.

(56) References Cited

U.S. PATENT DOCUMENTS

| | | | | |
|---|---|---|---|---|
| 2020/0174586 A1* | 6/2020 | Yoshihara | ............. | G06F 3/0362 |
| 2021/0048846 A1* | 2/2021 | Hinson | ................... | G05G 1/02 |

FOREIGN PATENT DOCUMENTS

| | | | |
|---|---|---|---|
| EP | 3220402 | A1 | 9/2017 |
| JP | 5653180 | B2 | 11/2014 |
| JP | 6632787 | B2 | 12/2019 |
| WO | WO2016002202 | A1 | 1/2016 |

OTHER PUBLICATIONS

Extended European Search Report from corresponding European Patent Application No. 21191551.7, dated Jan. 14, 2022, 7pp.

* cited by examiner

*Primary Examiner* — Hang Lin
(74) *Attorney, Agent, or Firm* — Crowell & Moring LLP

(57) ABSTRACT

An operating apparatus is disposed on a surface of a detection panel including a transparent panel and a sensor panel. An operation body includes an upper wall, an inner peripheral wall, and an outer peripheral wall. A rotary assembly is housed in the operation body. The rotary assembly includes a supporter fixed to the detection panel and a rotational operation member rotatably supported by the supporter. The rotational operation member is rotatable together with the operation body. A press detection conductor is provided at a conductor supporting portion of the operation body. A rotation detecting conductor is provided at the rotational operation member.

18 Claims, 8 Drawing Sheets

OPERATION DEVICE

RELATED APPLICATION

The present application claims priority to Japanese Patent Application Number 2020-140919, filed Aug. 24, 2020, the entirety of which is hereby incorporated by reference.

BACKGROUND

1. Field of the Invention

The present invention relates to an operating apparatus disposed on the surface of a detection panel that detects a change in electrostatic capacitance to detect a pressing operation and a rotating operation.

2. Description of the Related Art

Japanese Patent No. 5653180 discloses technology relating to an operating knob disposed on a touch panel.

This technology includes a first protrusion and a second protrusion at a grasping portion. The first protrusion is protruded from the grasping portion by a spring. The distance between the touch panel and the end of the first protrusion is shorter than the distance between the touch panel and the end of the second protrusion in a state in which the grasping portion faces the touch panel. The grasping portion is supported in a recess of an armoring material provided on the touch panel so as to be capable of a rotating operation and a pressing operation.

When the grasping portion is pressed, signals are produced when the first protrusion comes into contact with the touch panel and when the second protrusion comes into contact with the touch panel. Rotating the grasping portion, with the first protrusion and the second protrusion in contact with the touch panel, allows detecting the position of the rotation.

Japanese Patent No. 6632787 discloses technology relating to an input apparatus in which a knob is disposed on a touch panel.

In this technology, a ring-shaped rotary supporter is disposed on a touch panel, and a ring-shaped operation body is rotatably supported by the rotary supporter. The operation body houses a conductive connector. The conductive connector supports three conductive terminals with different diameters. The operation body and the three conductive terminals are electrically connected via the conductive connector. Operating the operation body with a finger allows detecting the positions of the three conductive terminals on the touch panel.

The operating knob disclosed in Japanese Patent No. 5653180 is capable of pressing the grasping portion and rotating the grasping portion. However, the grasping portion has no hole, so that it is impossible to use a hole as a display area or an illumination area.

The operation body of the input apparatus disclosed in Japanese Patent No. 6632787 has a ring shape. However, the input apparatus can detect only a rotating operation, not both of a rotating operation and a pressing operation. Adding a pressure detecting mechanism to the input apparatus of Japanese Patent No. 6632787 would of course increase the size of the operation body.

SUMMARY

The present disclosure addresses the above problems of the related art. Accordingly, it is an object of the present disclosure to provide an operating apparatus that is capable of detecting both of a rotating operation and a pressing operation using an operation body having a hole and that is simple and small in overall shape.

In an aspect of the present disclosure, an operating apparatus disposed on a surface of a detection panel that detects a change in electrostatic capacitance includes a supporter, an operation body, a press detection conductor, and a rotation detecting conductor. The supporter is disposed on the surface of the detection panel. The operation body is supported by the supporter so as to be movable in a pressing direction along a reference axis orthogonal to the surface of the detection panel and a rotational direction about the reference axis. A hole is provided from the supporter to the operation body, and the reference axis is located in the hole. The press detection conductor faces the surface of the detection panel and is configured to move in the pressing direction along the reference axis. The rotation detecting conductor faces the surface of the detection panel and is configured to move in the rotational direction about the reference axis. The press detection conductor and the rotation detecting conductor are arranged around the hole. The press detection conductor is moved in the pressing direction by the pressing operation of the operation body. The rotation detecting conductor is moved in the rotational direction by the rotating operation of the operation body.

In the operating apparatus according to the aspect of the disclosure, it is preferable that the operation body include a circular outer rim about the reference axis and a circular inner rim about the reference axis, the outer rim being a rim of the hole, and that the supporter, the rotation detecting conductor, and the press detection conductor be located between the outer rim and the inner rim.

The operating apparatus according to the aspect of the disclosure may further include a light-transmissive member in the hole, the light-transmissive member allowing the detection panel to be viewed. In this case, the light-transmissive member is preferably part of the operation body.

In the operating apparatus according to the aspect of the disclosure, at least part of the operation body may be a conductive conduction operating portion, and when at least the operation body moves in the pressing direction, the press detection conductor and the rotation detecting conductor may be electrically connected to the conduction operating portion.

In the operating apparatus according to the aspect of the disclosure, a first conductor of the press detection conductor and the rotation detecting conductor may be provided at the operation body at least part of which is a conductive conduction operating portion and may be electrically connected to the conduction operating portion, a second conductor may be supported by the supporter, and when the operation body moves in the pressing direction, the second conductor supported by the supporter may be electrically connected to the conduction operating portion.

The operating apparatus according to the aspect of the disclosure may further include a rotational operation member rotatably supported by the supporter, wherein the rotation detecting conductor may rotate together with the rotational operation member, wherein the press detection conductor may move along the reference axis together with the operation body, and wherein the rotational operation member may rotate with a rotational motion of the operation body.

The operating apparatus according to the aspect of the disclosure may further include a pressing operation member supported by the supporter so as to move along the reference axis, wherein the press detection conductor may move along the reference axis together with the pressing operation member, wherein the rotation detecting conductor may rotate together with the operation body, and wherein the pressing operation member may move along the reference axis with a pressing motion of the operation body.

In the operating apparatus according to the aspect of the disclosure, it is preferable that the pressing operation member rotate with the operation body.

In the operating apparatus according to the aspect of the disclosure, it is preferable that a relative position of the press detection conductor and the rotation detecting conductor does not change while the operation body rotates.

In the operating apparatus according to the aspect of the disclosure, it is preferable that when the operation body moves in the pressing direction, the rotation detecting conductor and the press detection conductor be equally spaced apart from the surface of the detection panel.

In the operating apparatus according to the aspect of the disclosure, it is preferable that the press detection conductor and the rotation detecting conductor be longer in circumferential length centered on the reference axis than in radial width centered on the reference axis.

An operating apparatus according to an aspect of the present disclosure has a hole extending from the supporter to the operation body, in which the supporter, the rotation detecting conductor, and the press detection conductor are arranged in a peripheral area that does not overlap with the hole. This configuration allows the hole to be used for an area through which the detection panel can be viewed, an area in which an illumination mechanism or a display mechanism is disposed, or an area in which a new pressing operation mechanism is disposed. A light-transmissive member may be disposed in the hole so that the detection panel can be viewed through the light-transmissive member. Since the supporter, the rotation detecting conductor, and the press detection conductor are arranged around the hole, the opening area of the hole can be large, and the overall outside diameter can be small.

In particular, the structure in which the operation body has a ring shape (a donut shape) having a circular outer rim and a circular inner rim and in which the supporter, the rotation detecting conductor, and the press detection conductor are located between the outer rim and the inner rim of the operation body provides a simple appearance with only a ring-shaped operation body. Furthermore, since the overall surface serves as the operation body, it is easy to operate and the overall outside diameter can be decreased.

DETAILED DESCRIPTION OF THE PREFERRED EMBODIMENTS

Figure 1:
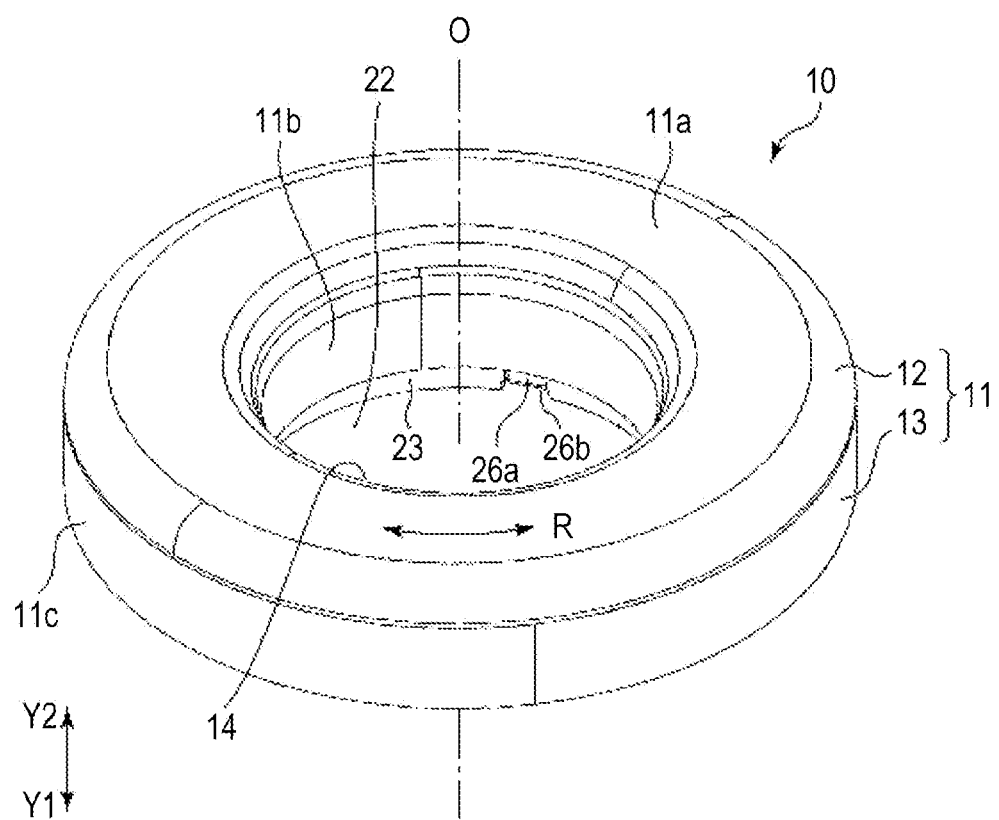
FIG. 1 is a perspective view of the overall structure of an operating apparatus according to a first embodiment of the present invention seen from above.
Figure 6:
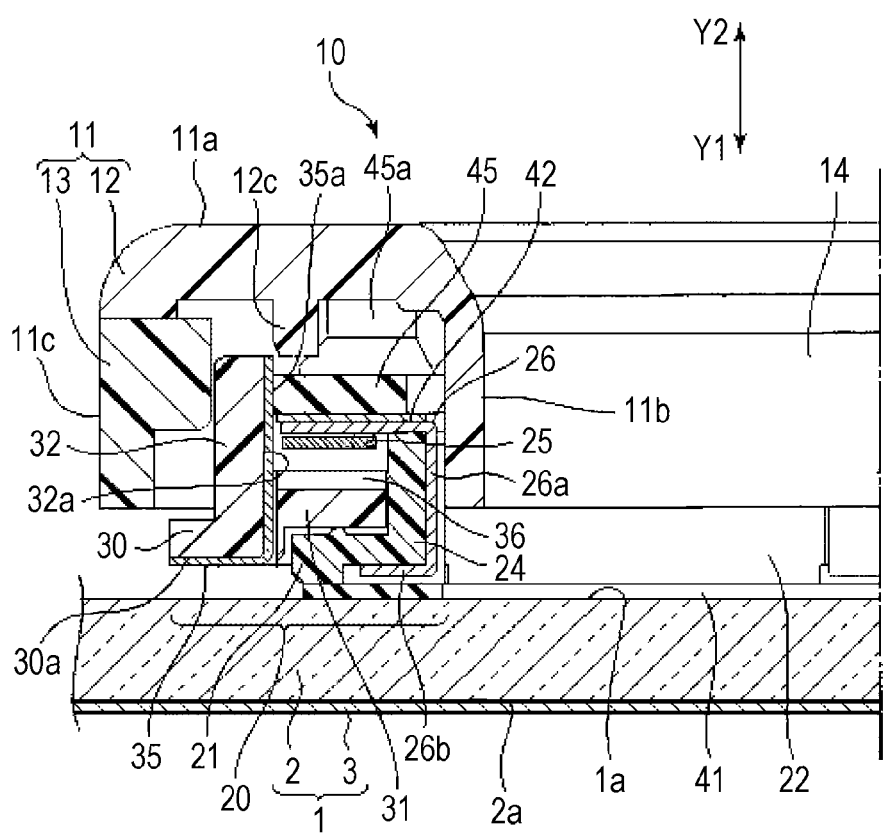
FIG. 6 is a partial cross-sectional view of the structure of the operating apparatus shown in FIG. 1 disposed on a detection panel, taken along line VI-VI in FIG. 5.
Figure 7:
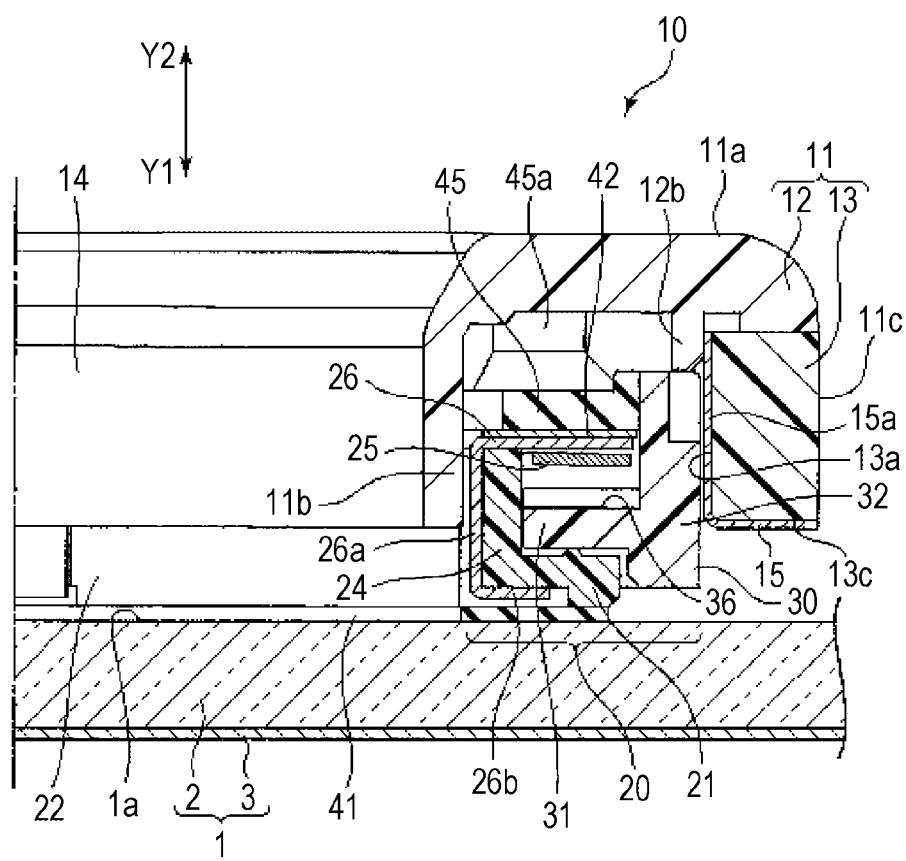
FIG. 7 is a partial cross-sectional view of the structure of the operating apparatus shown in FIG. 1 disposed on the detection panel, taken along line VII-VII in FIG. 5.

FIG. 1 illustrates an operating apparatus 10 according to a first embodiment of the present invention. FIG. 6 and FIG. 7 illustrate a structure in which the operating apparatus 10 is fixed to a surface 1a of a detection panel 1. The detection panel 1 is a transparent panel, for example, a surface panel of an electronic device in a vehicle cabin. On the back (in the Y1-direction) of the detection panel 1, a display screen of various kinds of display, such as a color liquid crystal display and an electroluminescence display, is located. The display screen displays various items of information on vehicle driving, for example, navigation information, road congestion information, moving speed information, air-conditioner operation information, or disaster warning information. Alternatively, the display screen displays audio information, television received image, or the like. The information displayed on the display screen passes through the detection panel and can be viewed from the front (Y2 side). The operating apparatus 10 can also be disposed on the surface 1a of the detection panel 1 provided with various electronic devices other than in-vehicle electronic devices.

The detection panel 1 shown in FIG. 6 and FIG. 7 includes a transparent panel 2 and a light-transmissive sensor panel 3 laminated on a back surface 2a of the transparent panel 2 facing the back (in the Y1-direction). The transparent panel 2 is a transparent resin panel, such as a glass panel or an acrylic panel. The sensor panel 3 is configured such that a plurality of transparent electrodes made of, for example, indium tin oxide (ITO), are provided on the surface of a transparent substrate made of polyethylene terephthalate (PET) or the like and detects a change in electrostatic capacitance. When a conductor having a potential close to the ground potential comes into contact with or close to the surface 1a of the detection panel 1, a mutual capacitance detected between the plurality of transparent electrodes of the sensor panel 3 changes, or capacitances detected at the individual transparent electrodes change, allowing the detection of what position on the coordinates of a plane parallel to the surface 1a the conductor is located.

Figure 2:
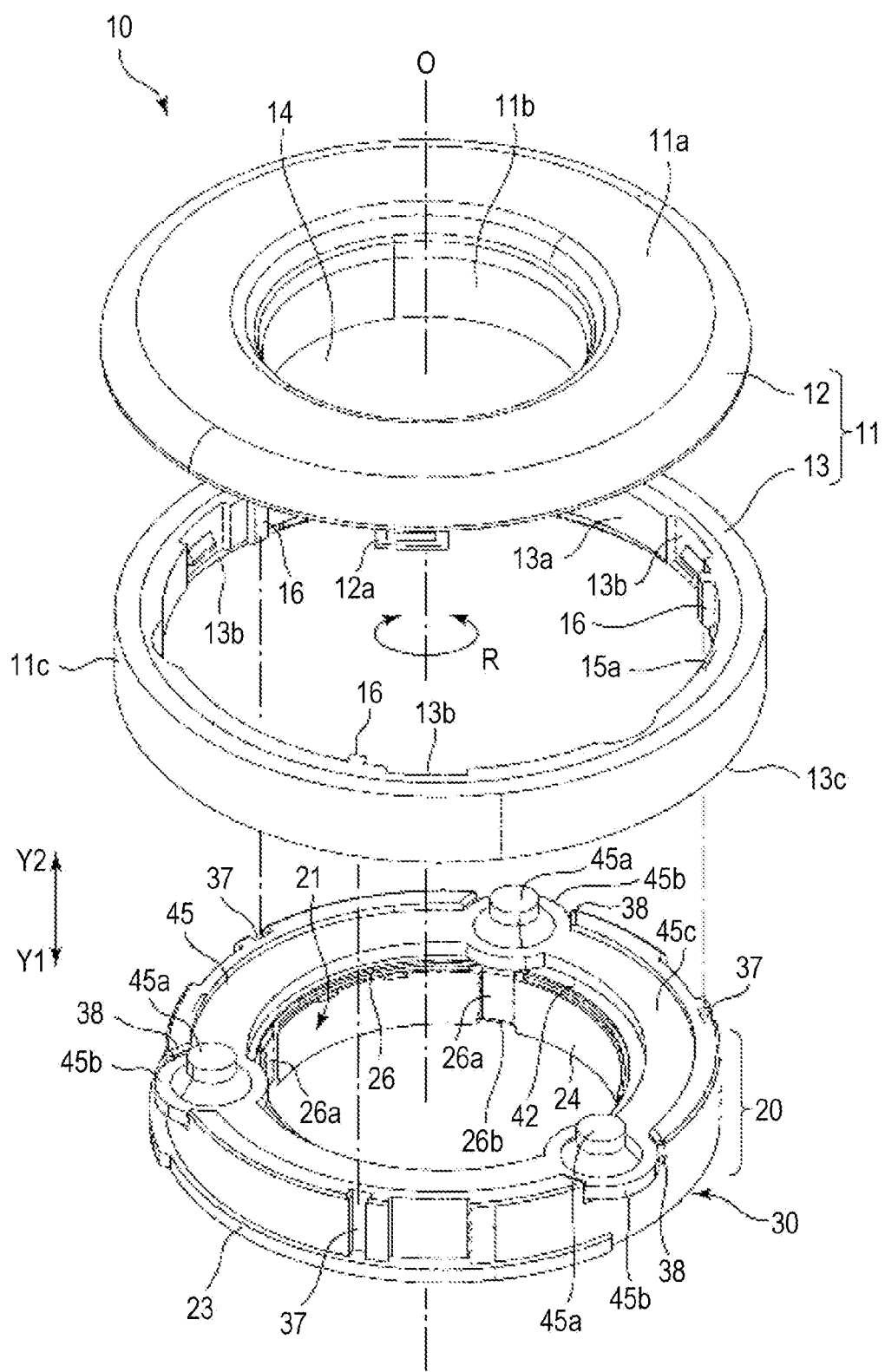
FIG. 2 is an exploded perspective view of the overall structure of the operating apparatus shown in FIG. 1 in which the operation body is separated above.

FIG. 1 to FIG. 5 illustrate a reference axis O. The reference axis O is a virtual straight line orthogonal to the surface 1a of the detection panel 1. As shown in FIG. 1, FIG. 2, and FIG. 6, the operating apparatus 10 includes an operation body 11. The operation body 11 has a ring shape (donut shape) centered on the reference axis O. The operation body 11 has a circular hole 14 at the center, in which the reference axis O is located.

As shown in FIG. 2, the operation body 11 includes a conduction operating portion 12 and a conductor supporting portion 13. The conduction operating portion 12 has fitting protrusions 12a protruding backward (in the Y1-direction). The conductor supporting portion 13 has recesses 13b in an inner peripheral surface 13a. The fitting protrusions 12a are fitted in the recesses 13b so that the conduction operating portion 12 and the conductor supporting portion 13 are fixed to each other. The conduction operating portion 12 is electrically conductive and made of conductive metal. Alternatively, the conduction operating portion 12 may be formed of a synthetic resin material, on the surface of which a conductive metal plate layer is provided. The conductor supporting portion 13 is non-conductive and made of a synthetic resin material.

The operation body 11 of an embodiment of the present invention is composed of a single member or a plurality of members joined together, at least part of which constitute a conductive conduction operating portion.

As shown in FIG. 1, FIG. 2, and FIG. 6, the operation body 11 has an upper wall 11a, an inner peripheral wall 11b, and an outer peripheral wall 11c. The upper wall 11a is a ring-shaped portion at the front of the conduction operating portion 12. The front of the upper wall 11a oriented in the Y2-direction is the main operation surface. The inner peripheral wall 11b is a cylindrical portion, which is part of the conduction operating portion 12 and extends from the inner periphery of the upper wall 11a backward (in the Y1-direction). The outer peripheral wall 11c is formed of the cylindrical conductor supporting portion 13.

The portion having the smallest inside diameter out of the surface of the inner peripheral wall 11b is the rim of the hole 14 and the inner rim of the operation body 11. The portion having the largest outside diameter out of the outer peripheral wall 11c is the outer rim of the operation body 11. As shown in the cross-sectional views of FIG. 6 and FIG. 7, all of the components of the operating apparatus 10 are disposed between the inner rim and the outer rim of the operation body 11. In other words, all of the components are covered with the operation body 11. Accordingly, the appearance of the operating apparatus 10 seen from below is the same as the appearance of the ring-shaped (donut-shaped) operation body 11.

Figure 5:
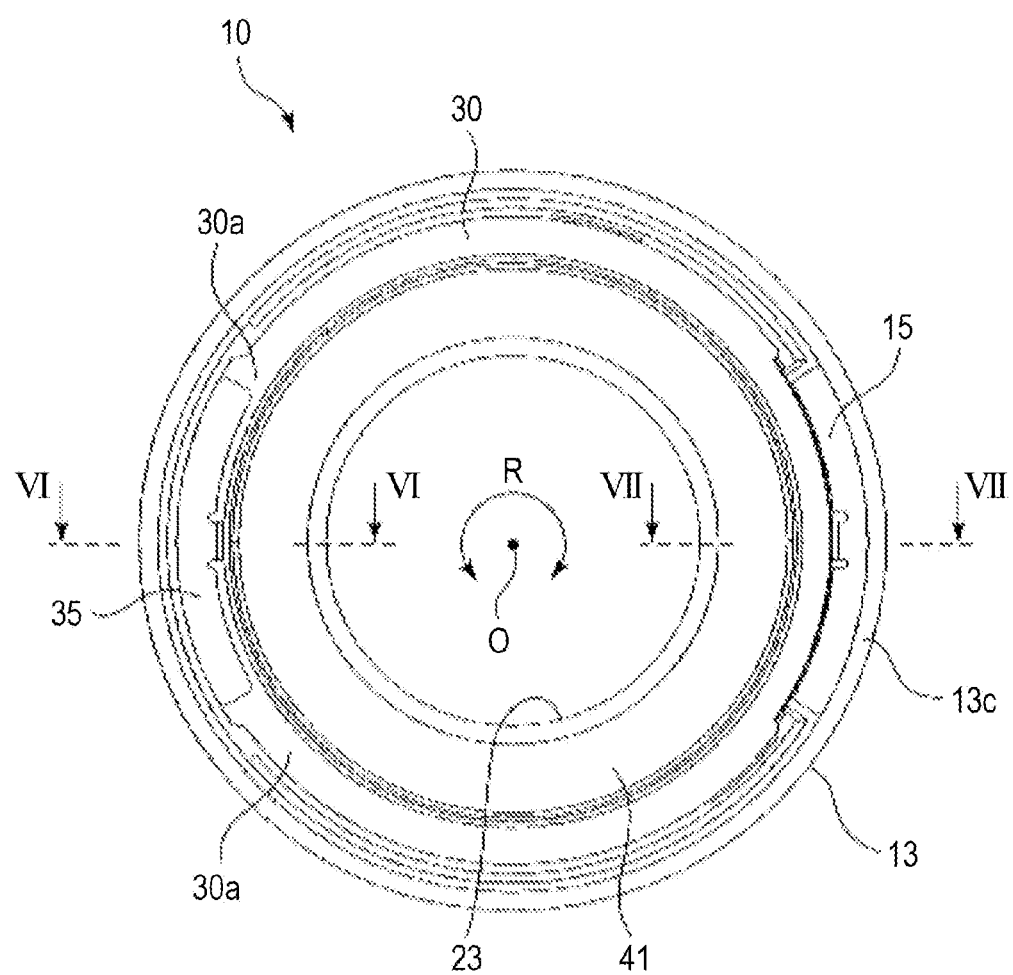
FIG. 5 is a bottom view of the operating apparatus shown in FIG. 1 seen from below.

As shown in the bottom view of FIG. 5 and FIG. 7, the back surface 13c of the conductor supporting portion 13 oriented backward (in the Y1-direction) is provided with a press detection conductor 15. The press detection conductor 15 is provided in the range of a given angle along an arc locus about the reference axis O. In other words, the press detection conductor 15 has a partial ring shape along the arc locus about the reference axis O, whose circumferential length is larger than the radial width. As shown in FIG. 2 and FIG. 7, part of the press detection conductor 15 is an extension 15a extending in the front-to-back direction (Y1- to Y2-direction) along the inner peripheral surface 13a of the conductor supporting portion 13. The press detection conductor 15 is made of a thin metal plate, which is integrated with the conductor supporting portion 13 by a so-called insert molding process when the conductor supporting portion 13 is formed. Alternatively, the press detection conductor 15 may be formed by applying a conductive paint to the conductor supporting portion 13.

As shown in FIG. 7, the conduction operating portion 12 is integrally provided with a connecting protrusion (a conductive connecting portion) 12b extending from the back surface of the upper wall 11a backward (in the Y1-direction). The connecting protrusion 12b is normally in contact with the extension 15a of the press detection conductor 15. Since the conduction operating portion 12 and the connecting protrusion 12b are conductive, the surface of the conduction operating portion 12 oriented in the Y2-direction, that is, a main contact operation surface, and the press detection conductor 15 are electrically connected.

Figure 4:
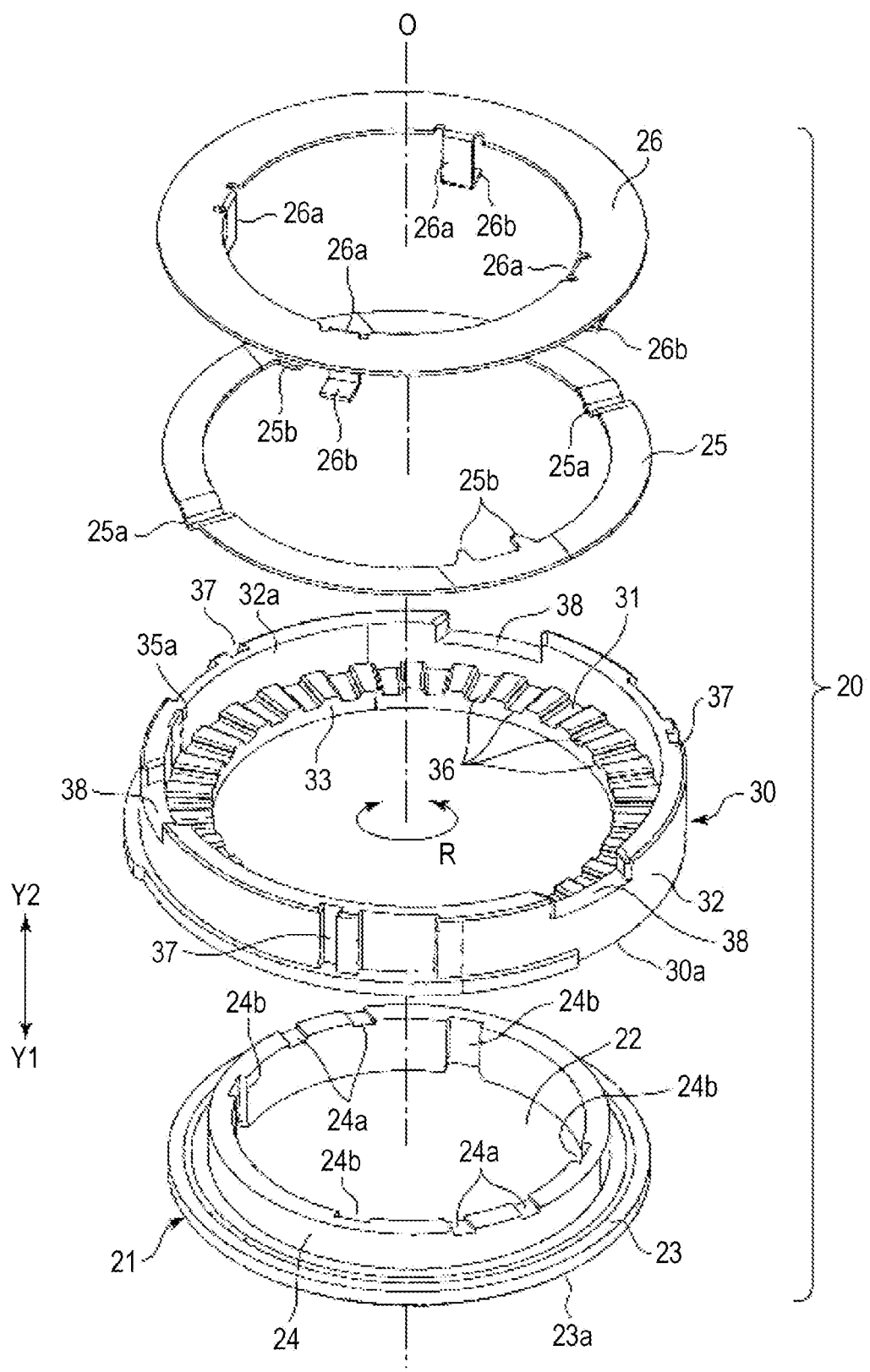
FIG. 4 is an exploded perspective view of the rotary assembly shown in FIG. 3 in vertically exploded view.

As shown in FIG. 6 and FIG. 7, the operation body 11 houses a rotary assembly 20. FIG. 4 illustrates the components of the rotary assembly 20 in exploded view. The rotary assembly 20 includes a supporter 21. The supporter 21 is made of a non-conductive material, such as a synthetic resin material, and has a circular supporter-side hole (opening) 22 at the center. The reference axis O is located in the hole 22. The supporter 21 includes a ring-shaped fixing portion 23 and a cylindrical supporting portion 24 erected from the inner rim of the fixing portion 23 forward (in the Y2-direction).

Figure 3:
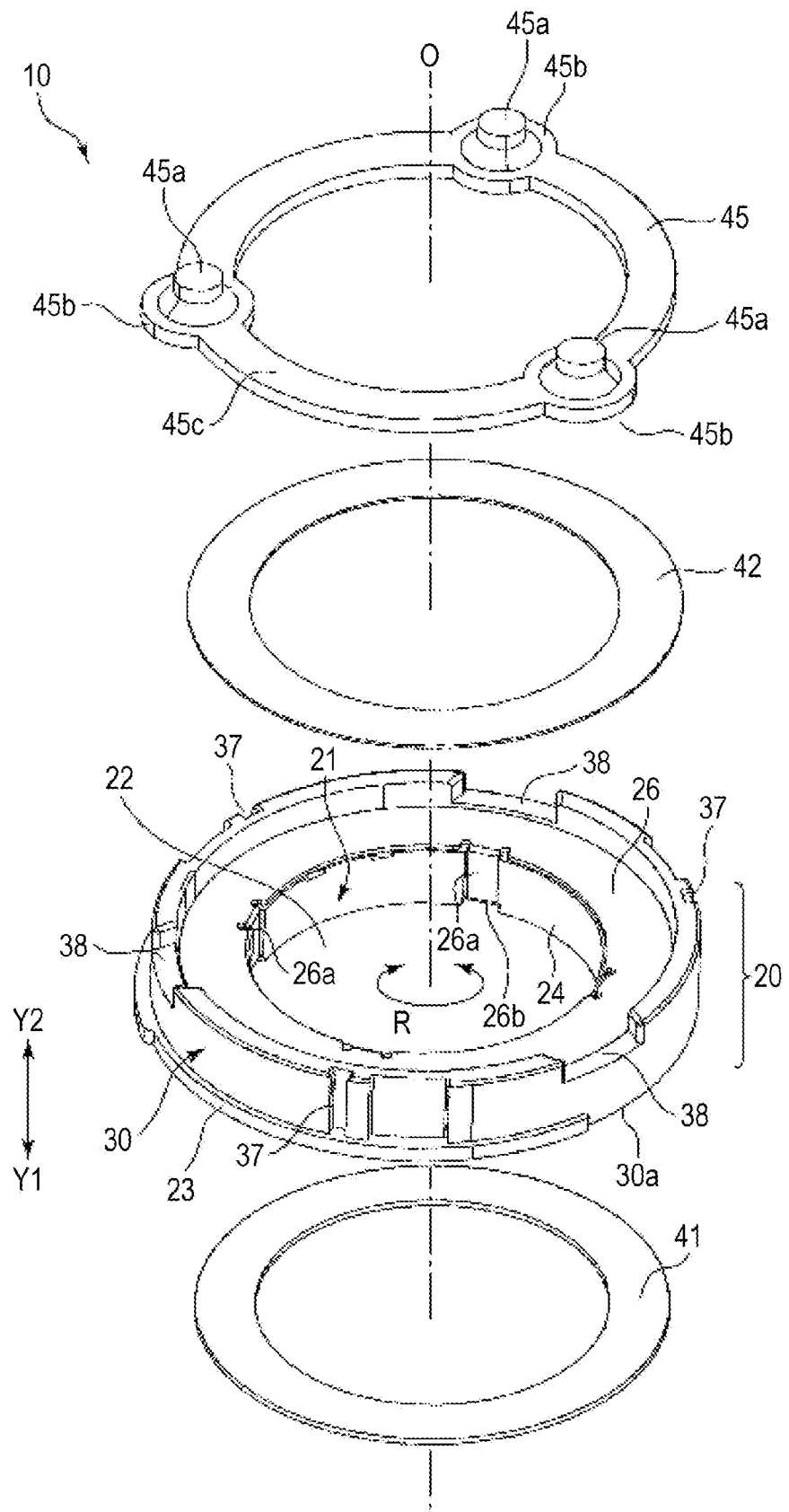
FIG. 3 is an exploded perspective view of an assembly structure of the operating apparatus shown in FIG. 2 in which the operation body is omitted.

As shown in FIG. 3 and FIG. 4, the rotary assembly 20 is configured such that the cylindrical supporting portion 24 of the supporter 21 rotatably supports a rotational operation member 30. The rotational operation member 30 is non-conductive and is made of a synthetic resin material. The rotational operation member 30 includes a ring-shaped gear bottom 31 and a connecting cylindrical portion 32 extending from the outer periphery of the gear bottom 31 forward (in the Y2-direction) which are integrated with each other. The gear bottom 31 has a circular slide hole 33 in the center. The slide hole 33 is rotatably fitted on the outer periphery of the cylindrical supporting portion 24 of the supporter 21.

As shown in the bottom view of FIG. 5 and FIG. 6, the back surface 30a of the rotational operation member 30 oriented backward (in the Y1-direction) is provided with a rotation detecting conductor 35. The rotation detecting conductor 35 is provided in the range of a given angle along an arc locus about the reference axis O. In other words, the rotation detecting conductor 35 has a partial ring shape along the arc locus about the reference axis O, whose circumferential length is larger than the radial width. As shown in FIG. 4 and FIG. 6, part of the rotation detecting conductor 35 is an extension 35a extending in the front-to-back direction (in the Y1- to Y2-direction) along the inner peripheral surface 32a of the connecting cylindrical portion 32 of the rotational operation member 30. The rotation detecting conductor 35 is made of a thin metal plate, which is integrated with the rotational operation member 30 by a so-called insert molding process when the rotational operation member 30 is formed. Alternatively, the rotation detecting conductor 35 may be formed by applying a conductive paint to the rotational operation member 30.

As shown in FIG. 6, the conduction operating portion 12 is provided with a connecting protrusion (a conductive connecting portion) 12c extending from the back surface of the upper wall 11a backward (in the Y1-direction). In FIG. 6, the connecting protrusion 12c is spaced apart from the extension 35a of the rotation detecting conductor 35 forward (in the Y2-direction). When the operation body 11 is pushed backward (in the Y1-direction) to move, the connecting protrusion 12c comes into contact with the extension 35a to electrically connect the main contact operation surface of the conduction operating portion 12 oriented in the Y2-direction and the rotation detecting conductor 35.

As shown in FIG. 4, the rotary assembly 20 includes a ring-shaped plate spring 25 inside the connecting cylindrical portion 32 of the rotational operation member 30. The ring-shaped plate spring 25 includes click engaging portions 25a that are bent and protruded backward (in the Y1-direction) at two places. A plurality of gear recesses 36 are provided at regular pitches in the circumferential direction at the front of the gear bottom 31 of the rotational operation member 30. The two click engaging portions 25a can engage with any of the plurality of gear recesses 36 in order. The ring-shaped plate spring 25 includes a pair of engage tabs 25b protruding inward at two places. The cylindrical supporting portion 24 of the supporter 21 has a pair of engage recesses 24a at two places at the front. The engage tabs 25b engage with the corresponding engage recesses 24a to prevent the ring-shaped plate spring 25 from rotating relative to the supporter 21.

The rotary assembly 20 includes a holder 26. The holder 26 has a ring shape and has connecting pieces 26a integrally formed backward (in the Y1-direction) at four positions of the inner rim. At the rear end of each connecting piece 26a, a retaining piece 26b bent outward is formed. As shown in FIG. 4, the cylindrical supporting portion 24 of the supporter 21 has connecting recesses 24b in which the connecting pieces 26a are to be fitted at four places on the inner peripheral surface.

As shown in FIG. 3, FIG. 6, and FIG. 7, the cylindrical supporting portion 24 of the supporter 21 is inserted from the back into the slide hole 33 of the rotational operation member 30, so that the ring-shaped plate spring 25 and the holder 26 are overlapped at the front side of the gear bottom 31 of the rotational operation member 30. The connecting pieces 26a of the holder 26 are fitted in the connecting recesses 24b of the inner peripheral surface of the cylindrical supporting portion 24, and the retaining pieces 26b at the rear ends of the connecting pieces 26a are engaged with the back surface 23a of the fixing portion 23 of the supporter 21 to assemble the rotary assembly 20. The rotary assembly 20 is configured to rotate the rotational operation member 30 relative to the supporter 21 around the reference axis O, with the supporter 21, the ring-shaped plate spring 25, and the holder 26 connected to each other. At the rotation, the gear recesses 36 of the rotational operation member 30 engage with the click engaging portions 25a of the ring-shaped plate spring 25 every given rotation angle to give the rotational operation member 30 click rotation resistance.

As shown in FIG. 3, FIG. 6, and FIG. 7, a double-sided adhesive tape 41 is bonded to the back surface 23a of the fixing portion 23 of the supporter 21 of the rotary assembly 20.

As shown in FIG. 3, a ring-shaped sheet 42 is disposed at the front of the holder 26 inside the connecting cylindrical portion 32 of the rotary assembly 20, and a returning elastic member 45 is disposed at the front of the ring-shaped sheet 42. The ring-shaped sheet 42 is formed of a low-friction sheet material. The returning elastic member 45 is formed of a rubber material and includes elastically deformable protrusions 45a at three places on the circumference of a ring-shaped main body 45c. The elastically deformable protrusions 45a are hollow and exhibit a forward elastic returning force (in the Y2-direction) against a backward pressing force (in the Y1-direction). As shown in FIG. 2 and FIG. 3, the connecting cylindrical portion 32 of the rotational operation member 30 has connecting recesses 38 that open forward (in the Y2-direction). The returning elastic member 45 has circular bases 45b at the bases of the elastically deformable protrusions 45a. The circular bases 45b are individually fitted in the connecting recesses 38. When the rotational operation member 30 rotates in the rotary assembly 20, the returning elastic member 45 rotates together with the rotational operation member 30 on the ring-shaped sheet 42.

As shown in FIG. 6 and FIG. 7, the rotary assembly 20 is housed between the inner peripheral wall 11b and the outer peripheral wall 11c of the operation body 11. As shown in FIG. 2, rotation connecting protrusions 16 extending in the front-to-back direction (in the Y1-to Y2-direction) are formed at three places of the inner peripheral surface 13a of the conductor supporting portion 13, and rotation connecting recesses 37 extending in the front-to-back direction (Y1- to Y2-direction) are formed at three places of the outer peripheral surface of the connecting cylindrical portion 32 of the rotational operation member 30. The rotation connecting protrusions 16 engage with the individual rotation connecting recesses 37, so that the operation body 11 and the rotational operation member 30 are connected so as to rotate together. The operation body 11 can move in the front-to-back direction (the Y1- to Y2-direction) relative to the rotational operation member 30 and the supporter 21. The operation body 11 is urged in the direction away from the rotary assembly 20 forward (in the Y2-direction) by the elastic force of the elastically deformable protrusions 45a of the returning elastic member 45. To prevent the operation body 11 from being separated forward from the rotary assembly 20, a retaining structure is provided between the operation body 11 and the rotational operation member 30.

As shown in FIG. 1, FIG. 6, and FIG. 7, when the operation body 11 and the rotary assembly 20 are combined, the hole 14 at the center of the operation body 11 and the hole 22 of the supporter 21 communicate with each other to form a hole along the reference axis O in an area including the reference axis O in the operating apparatus 10. The hole is open in the operating apparatus 10 in the front-to-back direction (in the Y1- to Y2-direction).

As shown in FIG. 6 and FIG. 7, the back surface 23a of the fixing portion 23 of the supporter 21 and the surface 1a of the detection panel 1 are bonded with the double-sided adhesive tape 41, so that the operating apparatus 10 is disposed on the detection panel 1.

As shown in FIG. 6 and FIG. 7, components of the operating apparatus 10 other than the operation body 11 are housed in the space between the inner peripheral wall 11b and the outer peripheral wall 11c of the operation body 11 (between the inner rim and the outer rim of the operation body 11). As shown in FIG. 1, the appearance of the operating apparatus 10 seen from the front (Y2) is the appearance of the ring-shaped (donut-shaped) operation body 11 itself. As a result, the operating apparatus 10 has a simple design, good appearance, and is easy to operate with a finger.

At the center of the operating apparatus 10, the circular hole 14 of the operation body 11 is open with a relatively large area. This allows part of an image displayed on the display screen on the back (in the Y1-direction) of the detection panel 1 to be viewed through the hole 14. This also allows disposing a separate display device including a light-emitting diode (LED) by using the inner space of the hole 14 or disposing a separate pressure operating apparatus in the hole 14.

Next, the operation on the operating apparatus 10 and a detection operation will be described.

As shown in FIG. 6 and FIG. 7, when no external force is acting on the operation body 11, the operation body 11 is lifted forward (in the Y2-direction) by the elastic pressing force of the elastically deformable protrusions 45a formed on the returning elastic member 45. This causes, as shown in FIG. 7, the press detection conductor 15 to be separated forward (in the Y2-direction) from the surface 1a of the detection panel 1. As shown in FIG. 6, the connecting protrusion (conductive connecting portion) 12c provided at the conduction operating portion 12 is separated forward (in the Y2-direction) from the extension 35a of the rotation detecting conductor 35 provided at the rotational operation member 30, so that the conduction operating portion 12 and the rotation detecting conductor 35 are not electrically connected.

In the operation body 11, the extension 15a of the press detection conductor 15 provided on the conductor supporting portion 13 is in contact with the connecting protrusion (conductive connecting portion) 12b, so that the conduction operating portion 12 and the press detection conductor 15 are normally electrically connected. For that reason, when a finger of the operator touches the surface (the main operation surface) of the upper wall 11a of the operation body 11, the potential of the press detection conductor 15 becomes almost the ground potential which is the same as that of the body of the operator. When the operation body 11 is pushed backward (in the Y1-direction) by a finger pressing operation, the conductor supporting portion 13 is moved backward (in the Y1-direction) with respect to the rotational operation member 30 to bring the press detection conductor 15 close to the surface 1a of the detection panel 1. Since the press detection conductor 15 is at almost the ground potential, the coordinate position to which the press detection conductor 15 comes close is detected by the sensor panel 3.

When the operation body 11 is pushed backward (in the Y1-direction), the connecting protrusion 12c shown in FIG. 6 comes into contact with the extension 35a of the rotation detecting conductor 35 provided at the rotational operation member 30 to bring the conduction operating portion 12 of the operation body 11 and the rotation detecting conductor 35 into conduction. This causes the finger that pushes the operation body 11 and the rotation detecting conductor 35 to have the same potential, making the potential of the rotation detecting conductor 35 almost the ground potential. As shown in FIG. 6, the rotation detecting conductor 35 provided on the rotational operation member 30 is normally close to the surface 1a of the detection panel 1. Accordingly, when the potential of the rotation detecting conductor 35 becomes almost the ground potential which is the same as the potential of the finger, the coordinate position of the rotation detecting conductor 35 is detected by the sensor panel 3 of the detection panel 1.

A control unit (not shown) determines that a pressing operation has been performed when both of the coordinate position of the press detection conductor 15 and the coordinate position of the rotation detecting conductor 35 are detected by the sensor panel 3 of the detection panel 1. As shown in FIG. 5, the press detection conductor 15 and the rotation detecting conductor 35 have a partially ring shape extending in the direction of the arc around the reference axis O and are larger in the length in the arc direction than the width in the radial direction around the reference axis O. This provides sufficiently large areas for the press detection conductor 15 and the rotation detecting conductor 35 within a narrow radial range, allowing the press detection conductor 15 and the rotation detecting conductor 35 to be reliably detected by the sensor panel 3. The press detection conductor 15 and the rotation detecting conductor 35 face each other at an angle of 180 degrees with the reference axis O therebetween, and are spaced apart in the circumferential direction. Since the press detection conductor 15 and the rotation detecting conductor 35 which are partially ring-shaped do not overlap in the circumference direction centered on the reference axis O, the press detection conductor 15 and the rotation detecting conductor 35 can be reliably individually detected by the sensor panel 3.

When the operation body 11 is pushed in the Y1-direction, so that the press detection conductor 15 comes close to the surface 1a of the detection panel 1, the facing interval between the surface 1a of the detection panel 1 and the press detection conductor 15 in the front-to-back direction (the Y1- to Y2-direction) becomes equal to the facing interval between the surface 1a of the detection panel 1 and the rotation detecting conductor 35 in the front-to-back direction. When the operation body 11 is pushed for a rotating operation, the detection panel 1 can detect the press detection conductor 15 and the rotation detecting conductor 35 with the same sensitivity. This allows detecting the pressure and the rotation of the operation body 11 with high accuracy.

When the operation body 11 is pressed backward (in the Y1-direction), the control unit may determine that the operation body 11 has been pressed when the coordinate position of the press detection conductor 15 is detected by the sensor panel 3, irrespective of whether the rotation detecting conductor 35 is detected.

As shown in FIG. 2, the operation body 11 and the rotational operation member 30 can move relative to each other in the front-to-back direction (in the Y1- to Y2-direction) but are connected to each other in the direction of rotation (direction R) due to the engagement of the rotation connecting protrusions 16 at the conductor supporting portion 13 of the operation body 11 and the rotation connecting recesses 37 at the rotational operation member 30. For this reason, when the operation body 11 is rotated under pressure, the operation body 11 and the rotational operation member 30 rotate together around the reference axis O. The press detection conductor 15 and the rotation detecting conductor 35 with almost the ground potential rotate without changing in their relative position while keeping close to the surface 1a of the detection panel 1. The sensor panel 3 can detect the rotating coordinates of the press detection conductor 15 and the rotation detecting conductor 35. By detecting the movement of the coordinates of the press detection conductor 15 and the rotation detecting conductor 35, the control unit determines that the operation body 11 is rotated. Furthermore, the operation speed and the rotation angle of the operation body 11 can be respectively recognized from the speed and the angle of the change in coordinates at which the press detection conductor 15 and the rotation detecting conductor 35 are detected.

Since the press detection conductor 15 and the rotation detecting conductor 35 face each other at an angle of 180 degrees, with the reference axis O therebetween, and rotate in the direction of R without changing in relative angle, the rotary motion of the operation body 11 can be accurately detected by detecting changes in the coordinates of the press detection conductor 15 and the rotation detecting conductor 35 with the sensor panel 3. Furthermore, the press detection conductor 15 and the rotation detecting conductor 35 extend in the direction of the arc around the reference axis O and are larger in the length in the arc direction than the width in the radial direction around the reference axis O. This provides sufficiently large areas for the press detection conductor 15 and the rotation detecting conductor 35, allowing the press detection conductor 15 and the rotation detecting conductor 35 to be reliably detected by the sensor panel 3.

In the present disclosure, the center of the press detection conductor 15 in the circumferential direction and the center of the rotation detecting conductor 35 in the circumferential direction need not be located on the same radial line centered on the reference axis O and need only be located on different radial lines. It is preferable that the press detection conductor 15 and the rotation detecting conductor 35 do not overlap even partially on the same radial line. For that purpose, it is preferable that the center of the press detection conductor 15 and the center of the rotation detecting conductor 35 be disposed in the range from 90 degrees to 180 degrees about the reference axis O. The disposition in which the center of the press detection conductor 15 and the center of the rotation detecting conductor 35 are located on different radial lines so as not to overlap in the radial direction makes it easy to detect the press detection conductor 15 and the rotation detecting conductor 35 individually in a spaced-apart state.

Figure 8:
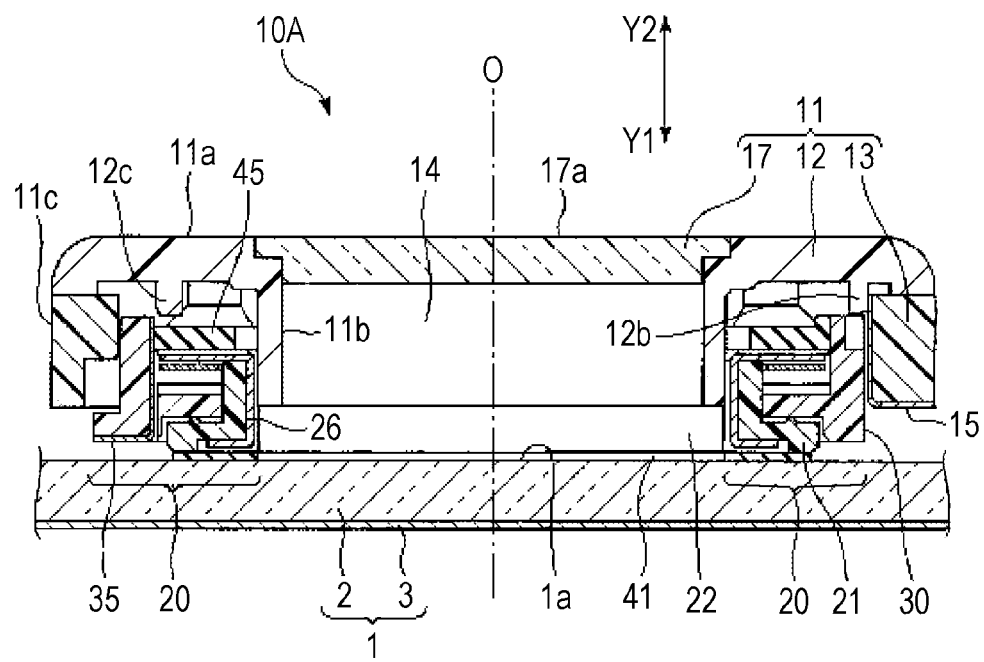
FIG. 8 is a cross-sectional view of an operating apparatus according to a second embodiment of the present invention disposed on a detection panel.

FIG. 8 illustrates an operating apparatus 10A according to a second embodiment of the present invention.

The operating apparatus 10A of the second embodiment includes a rotary assembly 20. The configuration of the rotary assembly 20 is the same as that of the rotary assembly 20 of the first embodiment. The rotary assembly 20 include a supporter 21 and a rotational operation member 30 rotatably supported by the supporter 21. The rotational operation member 30 is provided with a rotation detecting conductor 35. A press detection conductor 15 is provided on a conductor supporting portion 13 constituting an operation body 11.

The operation body 11 of the operating apparatus 10A includes a conduction operating portion 12, the conductor supporting portion 13, and a light-transmissive member 17. The conduction operating portion 12 is conductive. The conductor supporting portion 13 is non-conductive. The shapes of the conduction operating portion 12 and the conductor supporting portion 13 are substantially the same as those of the operating apparatus 10 of the first embodiment. The joined body of the conduction operating portion 12 and the conductor supporting portion 13 has a ring shape (a donut shape) and includes an upper wall 11a, an inner peripheral wall 11b, and an outer peripheral wall 11c. The area enclosed by the inner peripheral wall 11b is a hole 14. The portion having the smallest inside diameter out of the surface of the inner peripheral wall 11b is the inner rim of the hole 14, and the portion having the largest outside diameter out of the outer peripheral wall 11c is the outer rim of the operation body 11. All of the components constituting the rotary assembly 20 of the operating apparatus 10A are disposed between the inner rim and the outer rim of the joined body of the conduction operating portion 12 and the conductor supporting portion 13.

The light-transmissive member 17 is part of the operation body 11. The light-transmissive member 17 is made of a light-transmissive resin material, such as acrylic. The light-transmissive member 17 closes the hole 14 of the operation body 11. A surface 17a of the light-transmissive member 17 orientated forward (in the Y2-direction) is flush with the surface of the conduction operating portion 12. Since the operating apparatus 10A includes the light-transmissive area having the light-transmissive member 17 at the center of the operation body 11, part of the display screen can be viewed through the light-transmissive area and the detection panel 1. A display mechanism including a light source, such as an LED, may also be disposed in the hole 14.

Forming a transparent conductive layer, such as ITO, on the surface 17a of the light-transmissive member 17 and electrically connecting the conductive layer to the conduction operating portion 12 allow the surface 17a of the light-transmissive member 17 to be used as a contact operation surface.

Figure 9:
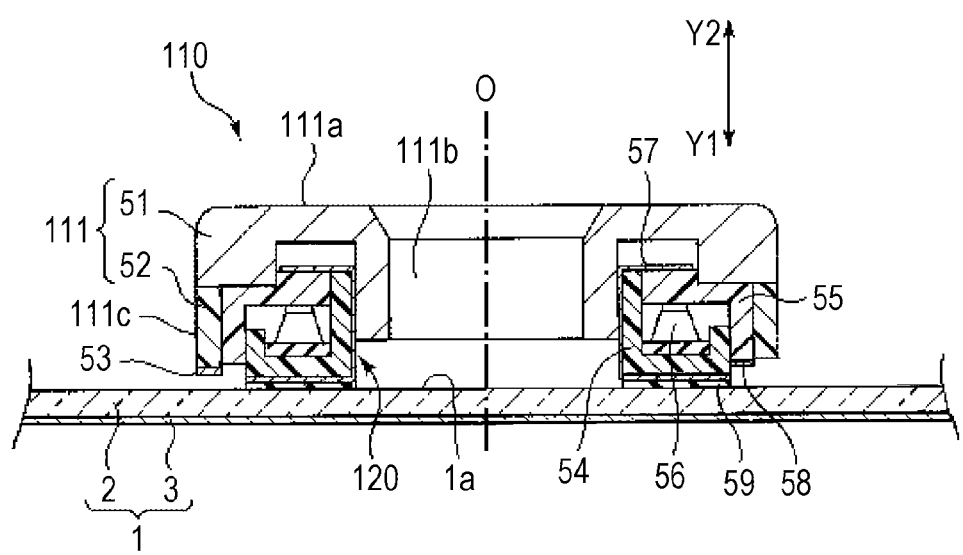
FIG. 9 is a cross-sectional view of an operating apparatus according to a third embodiment of the present invention disposed on a detection panel.

FIG. 9 illustrates an operating apparatus 110 according to a third embodiment of the present invention.

An operation body 111 of the operating apparatus 110 is configured such that a conductive conduction operating portion 51 and a non-conductive conductor supporting portion 52 are fixed. The operation body 111 has a donut shape having an upper wall 111a, an inner peripheral wall 111b, and an outer peripheral wall 111c. All of the components of the operating apparatus 110 except the operation body 111 are located between the inner peripheral wall 111b and the outer peripheral wall 111c. The surface of the conductor supporting portion 52 facing the detection panel 1 is provided with a rotation detecting conductor 53. The rotation detecting conductor 53 and the conduction operating portion 51 are electrically connected.

The operating apparatus 110 includes a pressing assembly 120. The pressing assembly 120 includes a supporter 54. The supporter 54 is bonded to the surface 1a of the detection panel 1 with a double-sided adhesive tape 59. A pressing operation member 55 is supported by the supporter 54 so as to be movable in the front-to-back direction (the Y1- to Y2-direction). A returning elastic member 56 is disposed between the supporter 54 and the pressing operation member 55. The pressing assembly 120 is assembled using a holder 57 so that the supporter 54, the returning elastic member 56, and the pressing operation member 55 are not separated. The surface of the pressing operation member 55 facing the detection panel 1 is provided with a press detection conductor 58. The press detection conductor 58 and the conduction operating portion 51 are electrically connected.

The operating apparatus 110 shown in FIG. 9 is configured such that, when the operation body 111 is pushed backward (in the Y1-direction), the pressing operation member 55 moves backward (in the Y1-direction) with respect to the supporter 54, and the operation body 111 and the pressing operation member 55 come close to the surface 1a of the detection panel 1 together. When the operation body 111 is rotated about the reference axis O, the pressing operation member 55 rotates together. Also, in the operating apparatus 110 shown in FIG. 9, the press detection conductor 58 and the rotation detecting conductor 53 keep the relative positions of 180 degrees about the reference axis O all the time, like the relationship between the press detection conductor 15 and the rotation detecting conductor 35 shown in FIG. 5. The press detection conductor 58 and the rotation detecting conductor 53 have a partial arch shape at a predetermined angle about the reference axis O.

In the operating apparatus 110 shown in FIG. 9, when no external force is acting on the operation body 111, the operation body 111 and the pressing operation member 55 are moved forward (in the Y2-direction) by the urging force of the returning elastic member 56, so that both of the rotation detecting conductor 53 and the press detection conductor 58 are separated from the surface 1a of the detection panel 1. When a finger of the operator touches the conduction operating portion 51 of the operation body 111, the potentials of the rotation detecting conductor 53 and the press detection conductor 58 which are electrically connected to the conduction operating portion 51 become almost the ground potential with the same potential as that of the finger. When the operation body 111 is pushed backward (in the Y1-direction) by the finger, the rotation detecting conductor 53 and the press detection conductor 58 come close to the surface 1a of the detection panel 1 together, and the coordinate positions of both of the rotation detecting conductor 53 and the press detection conductor 58 are detected by the sensor panel 3. Thus, a control unit (not shown) determines that a pressing operation has been performed. When the operation body 111 pushed by the finger is rotated as it is, the rotation detecting conductor 53 and the press detection conductor 58 are rotated together, with the interval of the angle of 180 degrees maintained. By detecting changes in the positions of the rotation detecting conductor 53 and the press detection conductor 58 with the sensor panel 3, the control unit can determine that a rotating operation has been performed.

The operating apparatus 10 of the first embodiment and the operating apparatus 110 of the third embodiment have a donut-shaped operation body having an inner peripheral wall and an outer peripheral wall, the components of which are located between the outer rim and the inner rim of the operation body. The pressing operation of the operation body allows the press detection conductor to be detected by the detection panel, and the rotating operation of the operation body allows the rotation detecting conductor to be detected. Since the overall structure has the same donut shape as that of the operation body, the overall shape is simple. Furthermore, the press detection conductor and the rotation detecting conductor are located between the outer rim and the inner rim of the operation body, thereby allowing the area of the hole of the operation body to be large, and the overall outside diameter to be small.

The hole 14 of the operation body 11 of the operating apparatus 10A of the second embodiment is covered with the light-transmissive member 17. Since the mechanisms are disposed behind the conduction operating portion 12 and the conductor supporting portion 13, which are non-light-transmissive members, and the hole 14 is light-transmissive and transparent, the appearance of the operating apparatus 10A viewed from the front is also in donut shape and exhibits a small and simple appearance. Moreover, the detection panel 1 can be viewed through the light-transmissive member 17.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. An operating apparatus disposed on a surface of a detection panel that detects a change in electrostatic capacitance, the operating apparatus comprising:
   a supporter on the surface of the detection panel;
   an operation body supported by the supporter so as to be movable in a pressing direction along a reference axis orthogonal to the surface of the detection panel and a rotational direction about the reference axis, wherein a hole is provided from the supporter to the operation body, and the reference axis is located in the hole,
   a press detection conductor facing the surface of the detection panel, the press detection conductor being configured to move in the pressing direction along the reference axis; and
   a rotation detecting conductor facing the surface of the detection panel, the rotation detecting conductor being configured to move in the rotational direction about the reference axis, the press detection conductor and the rotation detecting conductor being arranged around the hole,
   wherein the press detection conductor is moved in the pressing direction by the pressing operation of the operation body, and the rotation detecting conductor is moved in the rotational direction by the rotating operation of the operation body, and
   wherein at least part of the operation body is a conductive conduction operating portion, wherein, when at least the operation body moves in the pressing direction, the press detection conductor and the rotation detecting conductor are electrically connected to the conduction operating portion.

2. The operating apparatus according to claim 1, wherein the operation body includes a circular outer rim about the reference axis and a circular inner rim about the reference axis, the inner rim being a rim of the hole, and
   wherein the supporter, the rotation detecting conductor, and the press detection conductor are located between the outer rim and the inner rim.

3. The operating apparatus according to claim 1, further comprising a light-transmissive member in the hole, the light-transmissive member allowing the detection panel to be viewed.

4. The operating apparatus according to claim 3, wherein the light-transmissive member is part of the operation body.

5. The operating apparatus according to claim 1,
   wherein a first conductor of the press detection conductor and the rotation detecting conductor is provided at the operation body at least part of which is a conductive conduction operating portion and is electrically connected to the conduction operating portion,
   wherein a second conductor is supported by the supporter, and
   wherein, when the operation body moves in the pressing direction, the second conductor supported by the supporter is electrically connected to the conduction operating portion.

6. The operating apparatus according to claim 1, further comprising:
   a rotational operation member rotatably supported by the supporter,
   wherein the rotation detecting conductor rotates together with the rotational operation member,
   wherein the press detection conductor moves along the reference axis together with the operation body, and
   wherein the rotational operation member rotates with a rotational motion of the operation body.

7. The operating apparatus according to claim 1, further comprising:
   a pressing operation member supported by the supporter so as to move along the reference axis,
   wherein the press detection conductor moves along the reference axis together with the pressing operation member,
   wherein the rotation detecting conductor rotates together with the operation body, and
   wherein the pressing operation member moves along the reference axis with a pressing motion of the operation body.

8. The operating apparatus according to claim 7, wherein the pressing operation member rotates with the operation body.

9. The operating apparatus according to claim 6, wherein a relative position of the press detection conductor and the rotation detecting conductor does not change while the operation body rotates.

10. An operating apparatus disposed on a surface of a detection panel that detects a change in electrostatic capacitance, the operating apparatus comprising:
    a supporter on the surface of the detection panel;
    an operation body supported by the supporter so as to be movable in a pressing direction along a reference axis orthogonal to the surface of the detection panel and a rotational direction about the reference axis, wherein a hole is provided from the supporter to the operation body, and the reference axis is located in the hole, a press detection conductor facing the surface of the detection panel, the press detection conductor being configured to move in the pressing direction along the reference axis; and a rotation detecting conductor facing the surface of the detection panel, the rotation detecting conductor being configured to move in the rotational direction about the reference axis, the press detection conductor and the rotation detecting conductor being arranged around the hole, wherein the press detection conductor is moved in the pressing direction by the pressing operation of the operation body, and the rotation detecting conductor is moved in the rotational direction by the rotating operation of the operation body, and wherein, when the operation body moves in the pressing direction, the rotation detecting conductor and the press detection conductor are equally spaced apart from the surface of the detection panel.

11. The operating apparatus according to claim 1, wherein the press detection conductor and the rotation detecting conductor are longer in circumferential length centered on the reference axis than in radial width centered on the reference axis.

12. An operating apparatus disposed on a surface of a detection panel, the operating apparatus comprising:

an operation body movable in a pressing direction along a reference axis orthogonal to the surface of the detection panel and a rotational direction about the reference axis, wherein a hole is provided through the operation body, and the reference axis is located in the hole, a press detection conductor spaced apart from and facing the surface of the detection panel, the press detection conductor being configured to move in the pressing direction along the reference axis;

a pressing operation member configured to move along the reference axis, and a rotation detecting conductor facing the surface of the detection panel, the rotation detecting conductor being configured to move in the rotational direction about the reference axis, the press detection conductor and the rotation detecting conductor being arranged around the hole, wherein the press detection conductor is moved in the pressing direction by the pressing operation of the operation body, the rotation detecting conductor is moved in the rotational direction by the rotating operation of the operation body, and the pressing operation member rotates with the operation body.

13. The operating apparatus according to claim 12, wherein the operation body includes a circular outer rim about the reference axis and a circular inner rim about the reference axis, the inner rim being a rim of the hole, and wherein the rotation detecting conductor and the press detection conductor are located between the outer rim and the inner rim.

14. The operating apparatus according to claim 12, further comprising a light-transmissive member in the hole, the light-transmissive member allowing the detection panel to be viewed.

15. The operating apparatus according to claim 14, wherein the light-transmissive member is part of the operation body.

16. The operating apparatus according to claim 12, wherein at least part of the operation body is a conductive conduction operating portion, wherein, when at least the operation body moves in the pressing direction, the press detection conductor and the rotation detecting conductor are electrically connected to the conduction operating portion.

17. The operating apparatus according to claim 12, wherein the press detection conductor moves along the reference axis together with the pressing operation member, and the pressing operation member moves along the reference axis with a pressing motion of the operation body.

18. The operating apparatus according to claim 12, wherein a relative position of the press detection conductor and the rotation detecting conductor does not change while the operation body rotates.

* * * * *